(12) United States Patent
Sauer (10) Patent No.: US 6,518,847 B1
(45) Date of Patent: Feb. 11, 2003

(54) APPARATUS AND METHOD FOR A THERMAL FEEDBACK OSCILLATOR

(75) Inventor: Don R. Sauer, San Jose, CA (US)

(73) Assignee: National Semiconductor Corporation, Santa Clara, CA (US)

(*) Notice: Subject to any disclaimer, the term of this patent is extended or adjusted under 35 U.S.C. 154(b) by 12 days.

(21) Appl. No.: 09/880,162

(22) Filed: Jun. 12, 2001

(51) Int. Cl.[7] .............. G01K 7/00; H03L 7/00; H03L 1/00
(52) U.S. Cl. .............. 331/66; 331/34; 331/176
(58) Field of Search .............. 331/66, 70, 175, 331/176, 34, 74; 327/262, 371

(56) References Cited

U.S. PATENT DOCUMENTS 5,703,542 A * 12/1997 Blandino .............. 331/158
6,121,848 A    9/2000 Sauer .............. 331/108

* cited by examiner

Primary Examiner—Robert Pascal
Assistant Examiner—Kimberly E Glenn
(74) Attorney, Agent, or Firm—Merchant & Gould P.C.; John W. Branch (57) ABSTRACT

A method and apparatus is directed to generating an oscillation frequency utilizing the thermal heat transfer properties of semiconductor material as a feedback loop in an oscillator. The oscillator includes a comparator that compares two input signals and enables one of two heater circuits. Each heater circuit is thermally coupled to a sensor and reference circuit. Each sensor and reference circuit pair is arranged such that the reference circuit is heated while the sensor cools. The combination of each sensor and reference circuit produces input signals for the comparator. The frequency of the oscillator is determined by the heat transfer rate between the heater circuit and the corresponding sensor, and the thermal cooling rate of the other sensor. Changing the biasing currents, and distances between the heat sources and the thermal sensors adjust the duty cycle and frequency.

26 Claims, 8 Drawing Sheets

APPARATUS AND METHOD FOR A THERMAL FEEDBACK OSCILLATOR

FIELD OF THE INVENTION

The present invention relates to electronic oscillator circuits. In particular, the present invention relates to a method and apparatus that provides for an oscillator that includes a thermal feedback loop.

BACKGROUND OF THE INVENTION

Oscillator circuits are common building blocks in analog and digital electronic systems. Some example applications of oscillator circuits include: a source of regularly spaced pulses such as for a "clock" in a digital electronic system, an accurate time base in a frequency counter, a local oscillator in a transceiver circuit, as well as any other appropriate use.

Figure 1:
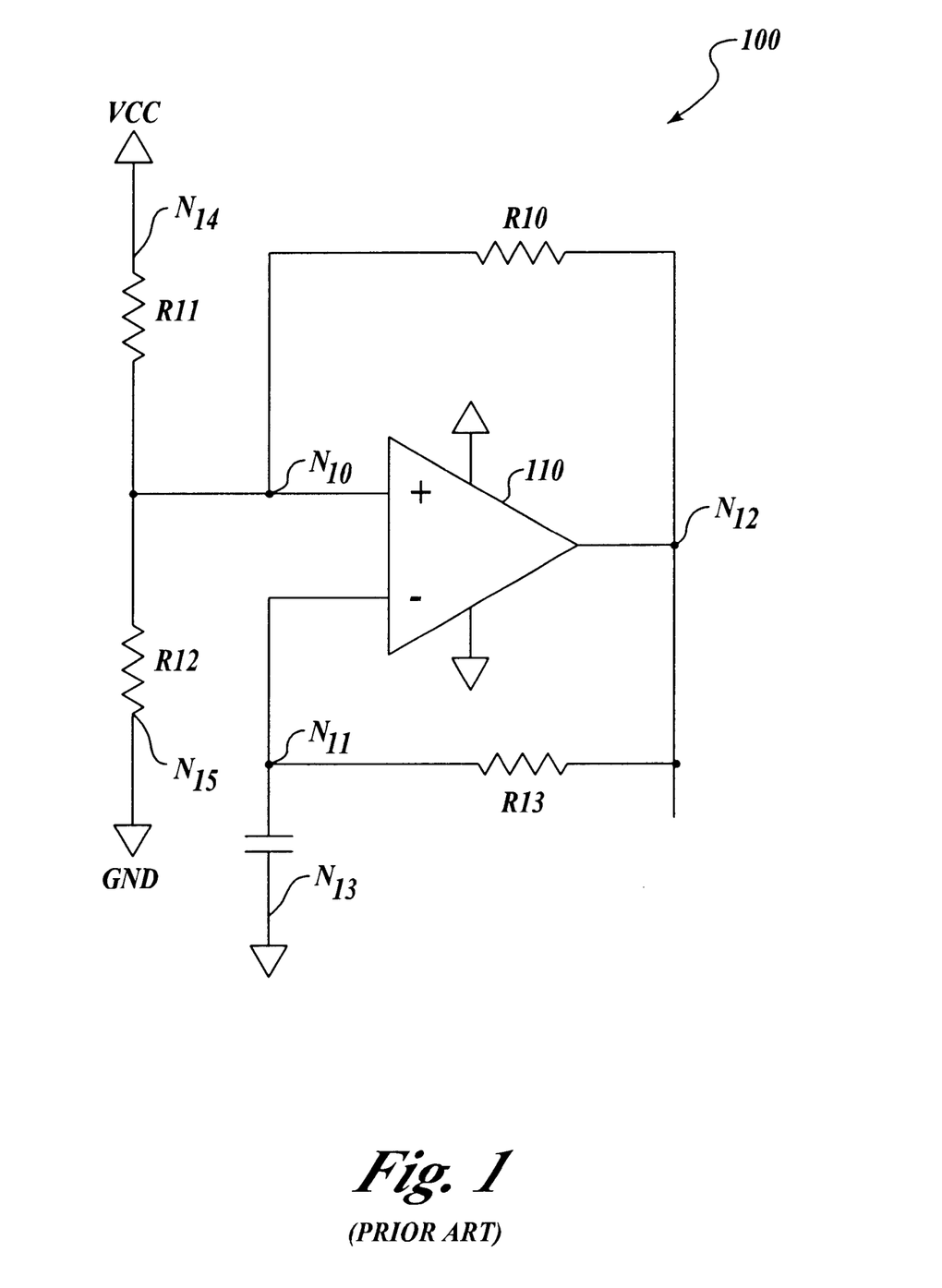
FIG. 1 illustrates an example of an RC oscillator circuit.

An example of an RC oscillator circuit (100) is shown in FIG. 1. Oscillator circuit 100 includes a comparator (110), four resistors ($R_{10}$–$R_{13}$), and a capacitor ($C_1$).

The comparator (110) includes a non-inverting input (+) that is connected to a node ($N_{10}$), an inverting input (−) that is connected to a node ($N_{11}$), and an output terminal that is connected to a node ($N_{12}$). Resistor $R_{10}$ is connected between node $N_{10}$ and node $N_{12}$. Resistor $R_{13}$ is connected between node $N_{11}$ and node $N_2$. The capacitor ($C_1$) is connected between node $N_{11}$ and node $N_{13}$. Resistor $R_{11}$ is connected between node $N_{10}$ and node $N_{14}$. Resistor $R_{12}$ is connected between node $N_{10}$ and node $N_{15}$.

In operation, the RC oscillator circuit (100) produces an output signal at node $N_{12}$. A power supply signal ($V_{cc}$) is connected to node $N_{14}$, while a ground potential is connected to node $N_{13}$. The comparator (110) produces a signal at node $N_{12}$ in response to a comparison of the potentials at the non-inverting (+) and inverting (−) terminals. (i.e., $V_{N12}=A_v \cdot (V_{N10}-V_{N11})$, where $A_v$=open loop gain of the comparator). The signal at node $N_{12}$ is a rail-to-rail signal that drives into $R_{13}$ and $C_1$. The time constant associated with $R_{13}$ and $C_1$ determines the oscillation frequency of the oscillator circuit (100). Resistors $R_{10}$, $R_{11}$, and $R_{12}$ determine the signal level of the oscillator circuit (100). When resistors $R_{10}$, $R_{11}$, and $R_{12}$ are of equal values, the oscillator circuit (100) will produce a voltage between ⅓ $V_{cc}$ and ⅔ $V_{cc}$ at the non-inverting input (+)

As described above, oscillator circuit 100 requires an exact value for $R_{13}$ and $C_1$ to change the oscillation frequency. A quartz oscillator circuit may be employed to improve frequency stability of an oscillator circuit. The use of quartz crystals and RC tuned oscillators are generally adjusted by non-integrated ("off-chip") components.

SUMMARY OF THE INVENTION

The present invention is directed to a method and apparatus that produces a controlled oscillation utilizing the inherent thermal properties of silicon. A thermal oscillator includes a comparator circuit, two heat sources, and two thermal sensors. The comparator circuit controls the heat sources. Heat transfers to the thermal sensors forming a thermal feedback loop. The comparator circuit is arranged to respond to the thermal feedback to form the oscillator. A temperature control circuit is utilized to bias the temperature threshold levels for the thermal sensors. The temperature threshold level will determine an operating frequency for the thermal oscillator.

Briefly stated, a method and apparatus is directed to generating an oscillation frequency utilizing the thermal heat transfer properties of semiconductor material as a feedback loop in an oscillator. The oscillator includes a comparator that compares two input signals and enables one of two heater circuits. Each heater circuit is thermally coupled to a sensor and reference circuit. Each sensor and reference circuit pair is arranged such that the reference circuit is heated while the sensor cools. The combination of each sensor and reference circuit produces input signals for the comparator. The frequency of the oscillator is determined by the heat transfer rate between the heater circuit and the corresponding sensor, and the thermal cooling rate of the other sensor. Changing the biasing currents, and distances between the heat sources and the thermal sensors adjust the duty cycle and frequency.

In accordance with an embodiment of the present invention, an apparatus is directed to producing an oscillation frequency utilizing the thermal heat transfer characteristics of a semiconductor material. The apparatus includes a heat circuit that is arranged to selectively produce a heat signal in response to the output signal. A thermal sensor circuit is arranged to produce a sense signal in response to the heat signal. A reference circuit is arranged to produce a reference signal in response to the sense signal. A comparator circuit is arranged to produce the output signal in response to the reference signal such that the output signal oscillates between two signal levels at the oscillation frequency, wherein the oscillation frequency is determined by a time constant associated with the heat transfer characteristics of the semiconductor material.

In accordance with another embodiment of the present invention, an apparatus is directed to producing an oscillation frequency utilizing the thermal heat transfer characteristics of a semiconductor material. The thermal oscillator includes a heat circuit that is arranged to selectively produce a heat signal in response to the output signal. A reference circuit is arranged to produce a reference signal. A thermal sensor circuit is arranged to produce a sense signal in response to the heat signal and the reference signal. A comparator circuit is arranged to produce the output signal in response to the sense signal such that the output signal oscillates between two signal levels at the oscillation frequency, wherein the oscillation frequency is determined by a time constant associated with the heat transfer characteristics of the semiconductor material.

In accordance with yet another embodiment of the present invention, a method is directed to producing an oscillation signal with a corresponding oscillation frequency and duty cycle utilizing thermal heat transfer characteristics of a semiconductor material. The method includes comparing a first input signal and a second input signal with a comparator, producing the output signal in response to the comparison, activating a first heat source to produce first heat signal in response to the output signal when the output signal corresponds to a first logic level, activating a second heat source to produce a second heat signal in response to the output signal when the output signal corresponds to a second logic level that is different from the first logic level, sensing the first heat signal to produce a first sense signal with a first thermal sensor, sensing the second heat signal to produce a second sense signal with a second thermal sensor, producing the first input signal in response to the first sense signal, and producing the second input signal in response to the second sense signal such that the output signal oscillates between the first and second logic level at a rate corresponding to the oscillation frequency.

In accordance with still another embodiment of the present invention, an apparatus is directed to producing an output signal with a corresponding oscillation frequency utilizing the thermal characteristics of a semiconductor material. The apparatus includes a comparison means that is arranged to produce an output signal in response to a comparison between a first input signal and a second input signal. A first heat means is arranged to produce a first heat signal when the output signal is a first logic level. A second heat means is arranged to produce a second heat signal when the output signal is a second logic level that is different from the first logic level. A first sense means is arranged to produce the first input signal in response to the first heat signal. A second sense means is arranged to produce the second input signal in response to the first heat signal, wherein the first and second input signals form a differential input signal for the comparison means such that output signal oscillates between the first and second logic levels at an oscillation frequency that is related to the thermal characteristics of the semiconductor material.

A more complete appreciation of the present invention and its improvements can be obtained by reference to the accompanying drawings, which are embodiments of the invention briefly summarized below, to the following detail description of presently preferred, and to the appended claims.

DETAILED DESCRIPTION OF THE PREFERRED EMBODIMENT

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data signal. The meaning of "a", "an", and "the" include plural references. The meaning of "in" includes "in" and "on".

The present invention relates to electronic oscillator circuits. More particularly, the present invention relates to a method and apparatus that provides for a thermal feedback oscillator. The present invention is directed to an integrated circuit oscillator that eliminates the use of an off-chip frequency-tuning element such as a crystal. Since the "off-chip" frequency tuning elements are eliminated, the external pin that is required to connect the external frequency tuning elements (i.e., resistors, capacitors, crystals, etc.) is unnecessary. Consequentially, integrating the frequency tuning elements "on-chip" reduces the costs associated with the oscillator circuit.

Figure 2:
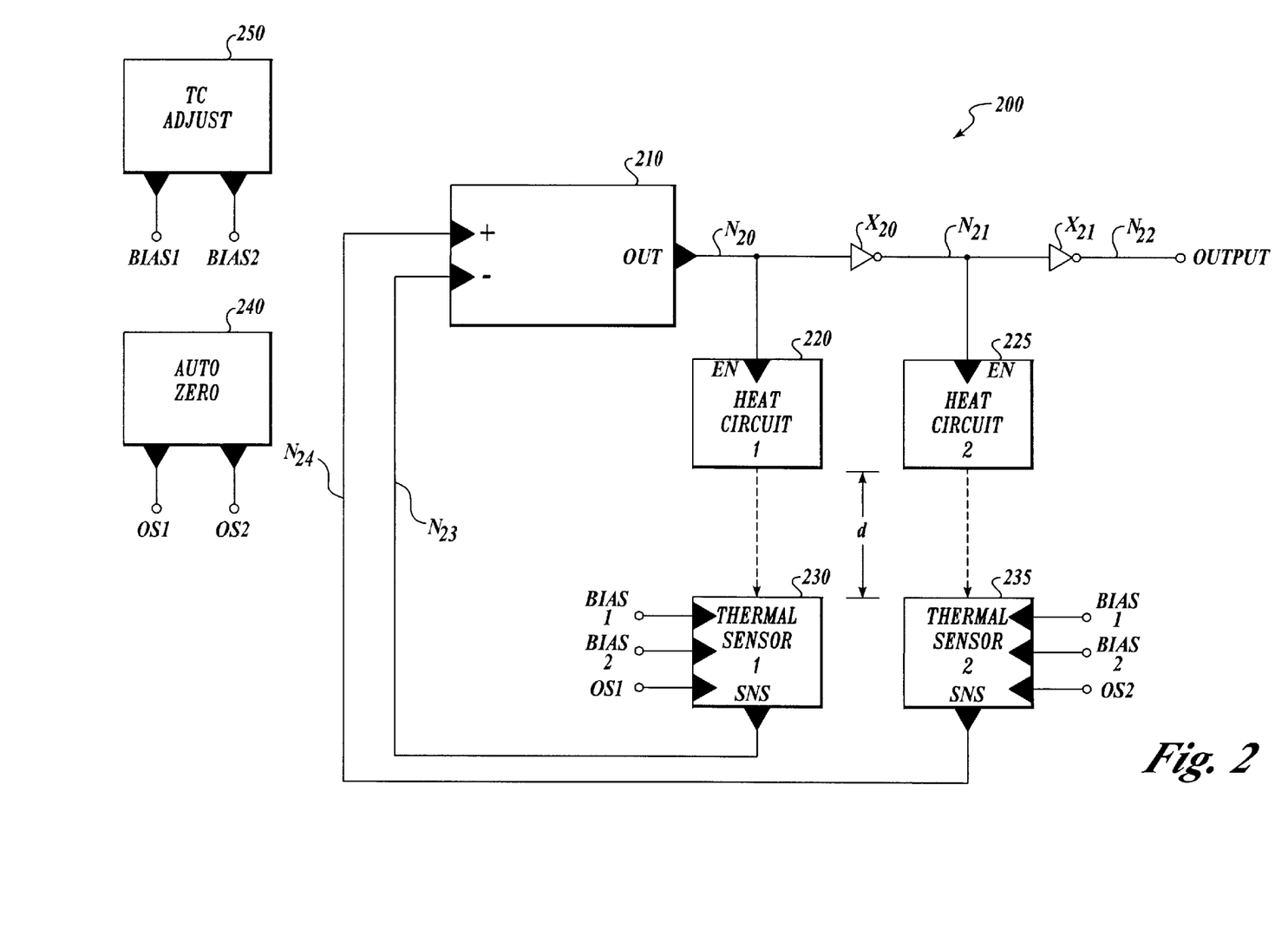
FIG. 2 is a schematic diagram illustrating an example of a thermal oscillator circuit that is in accordance with the present invention.

FIG. 2 is a schematic diagram illustrating an example of a thermal oscillator circuit (200) that is in accordance with the present invention. In FIG. 2, the thermal oscillator circuit (200) includes a comparator circuit (210), heat circuits (220 and 225), thermal sensors (230 and 235), an auto zero circuit (240), a TC adjust circuit (250), and inverters ($X_{20}$ and $X_{21}$).

The comparator circuit (210) includes a non-inverting input (+) that is coupled to a node ($N_{24}$), an inverting input (−) that is coupled to a node ($N_{23}$), an output terminal (OUT) that is coupled to a node ($N_{20}$), and input terminal (AZ) that is coupled to a node ($N_{25}$) Heat circuit 1 (220) includes an enable terminal (EN) that is coupled to node $N_{20}$. Inverter circuit $X_{20}$ is coupled between node $N_{20}$ and $N_{21}$. Heat circuit 2 (225) includes an enable terminal (EN) that is coupled to node $N_{21}$. Inverter circuit $X_{21}$ is coupled between node $N_{21}$ and $N_{22}$. An output terminal (OUTPUT) is coupled to node $N_{22}$. Thermal sensor 1 (230) includes an input that is thermally coupled to heat circuit 1 (220), bias input terminals that are coupled to bias signals (BIAS1 and BIAS2), an offset input terminal that is coupled to a first offset signal (OS1), and a sensor terminal (SNS) that is coupled to node $N_{23}$. Thermal sensor 2 (235) includes an input that is thermally coupled to heat circuit 2 (225), bias input terminals that are coupled to bias signals (BIAS1 and BIAS2), an offset input terminal that is coupled to a second offset signal (OS2), and a sensor terminal (SNS) that is coupled to node $N_{24}$. The auto zero circuit (240) includes a first output terminal that provides the first offset signal (OS1), and a second output terminal that provides the second offset signal (OS2). The TC adjust circuit (250) includes a bias signal terminal that is coupled to the first bias signal (BIAS1), and a second bias signal terminal that is coupled to the second bias signal (BIAS2).

In operation, the comparator circuit (210) produces an output signal at node $N_{20}$ that corresponds to the comparison between the signals at nodes $N_{24}$ and $N_{23}$ respectively. The signals at nodes $N_{23}$ and $N_{24}$ may be differential signals, or single-ended signals depending upon the implementation of the system. The output of the comparator (210) at node $N_{20}$ may be utilized as an oscillator output signal (OUTPUT) from the thermal oscillator circuit (200), either directly or through a series of buffers such as inverters $X_{20}$ and $X_{21}$ illustrated in FIG. 2. The output of the comparator (210) is used to activate one of the heat circuits (220, 225) depending on the logic state of the signal at node $N_{20}$. Only one of the heat circuits (220, 225) is activated at a time. When a heat circuit is activated, thermal energy propagates through the silicon from the heat circuit to a corresponding thermal sensor. The thermal sensors (thermal sensor 1 and thermal sensor 2) produce a signal that corresponds to a particular heat level. When one of the thermal sensors (230, 235) becomes hot it produces a corresponding signal that is greater than the signal it produces when the thermal sensor is cold. The output signals from the thermal sensors (230, 235) at nodes $N_{23}$ and $N_{24}$ are arranged to provide an inversion in the input to the comparator circuit (210) when sufficient heat has transferred to the corresponding sensor.

Once the sensors have heated sufficiently, the output of the comparator (210) at node $N_{20}$ will change logic state, thereby completing an oscillation cycle.

In one example, heat circuit 1 (220) is activated when the output of the comparator circuit (210) at node $N_{20}$ is high. Since the logic level at node $N_{21}$ is an inverse of the logic level at node $N_{20}$, heat circuit 2 (225) is deactivated when heat circuit 1 (220) is activated. Heat propagates from heat circuit 1 (220) to thermal sensor 1 (230) across distance (d). Thermnal sensor 1 (230) detects when the temperature within the sensor reaches a predetermined level. The signal produced at the sensor terminal (SNS) of thermal sensor 1 (230) will be higher than the signal produced at the sensor terminal (SNS) of thermal sensor 2 (235) due to the heating of thermal sensor 1 (230). The comparator (210) will compare the two signals and produce a low logic output. Since heat circuit 2 (225) is now activated and heat circuit 1 (220) is now deactivated an oscillation is formed in the output of the comparator (210). The oscillation frequency corresponds to the thermal transport delay from one of the heat circuits to the corresponding thermal sensor.

Different oscillation frequencies can be obtained by changing the predetermined threshold level of the thermal sensors (230, 235) utilizing the bias signals (BIAS1 and BIAS2). Additionally, different oscillation frequencies can be obtained by changing the distance (d) between the heat circuits (220, 225) and their corresponding thermal sensor circuits (230, 235). Furthermore, different oscillation frequencies can be obtained by changing the thermal transfer characteristics of the semiconductor material. Such changes may include using a silicon material with a different crystal lattice structure. Additionally, the integrated circuit may be produced from a different semiconductor material such as GaAs, Ge, or some other semiconductor material. Since semiconductor materials normally have processing constraints which require near perfect crystal structures, the heat transfer characteristics for a given semiconductor material with a given lattice structure will have minimal variations in its thermal heat transfer characteristics.

The duty cycle of the thermal oscillator circuit (200) can be changed utilizing one or more of the above methods for changing the frequency, but applying them unequally to the heat circuit/thermal sensor pairs. For example, thermal sensor 1 (230) may be located a distance ($d_1$) from heat circuit 1 (220), while thermal sensor 2 (235) is located a different distance ($d_2$) from heat circuit 2 (225). Since distances $d_1$ and $d_2$ are different, the heat transfer times are unequal and the oscillation frequency will have an uneven duty cycle.

TC adjust circuit 250 applies bias signals (BIAS1, BIAS2) to thermal sensor 1 (230) and thermal sensor 2 (235). The bias signals (BIAS1 and BIAS2) are arranged to adjust the frequency of the thermal oscillator circuit (200) by changing the biasing on the thermal sensors (230, 235). TC adjust circuit 250 controls the sensitivity level of each of the thermal sensors (230 and 235). The sensitivity levels correspond to the amount of heat required to reach the threshold of the thermal sensors. Since the heat circuits (220, 225) are located a predetermined distance (d) away from the thermal sensors (230, 235), the sensitivity levels of the thermal sensors will change the delay time between activation of a heat circuit and detection by the corresponding thermal sensor. Thus, the bias signals (BIAS1 and BIAS2) are used to adjust the thermal sensors (230 and 235) such that the oscillation frequency may be tuned.

Thermal sensors 230 and 235 are also arranged to adjust their signal levels in response to offset signals OS1 and OS2 respectively. The auto zero circuit is arranged to adjust offset signals OS1 and OS2 in response to the average duty cycle of the thermal oscillator circuit (200). The auto zero circuit is arranged such that offset signals OS1 and OS2 change very slowly in comparison to the oscillation frequency of the thermal oscillator circuit (200). In one example, auto zero circuit 240 includes an integrator with a relatively long time constant when compared to the oscillation frequency. The time constant of the integrator may be adjusted using "on-chip" resistors and capacitors, such as transistors that are arranged to operate as resistive and capacitive devices. Thus, auto zero circuit 240 is arranged to compensates for low frequency drift in the frequency and/or duty cycle of the thermal oscillator circuit 200.

Figure 3:
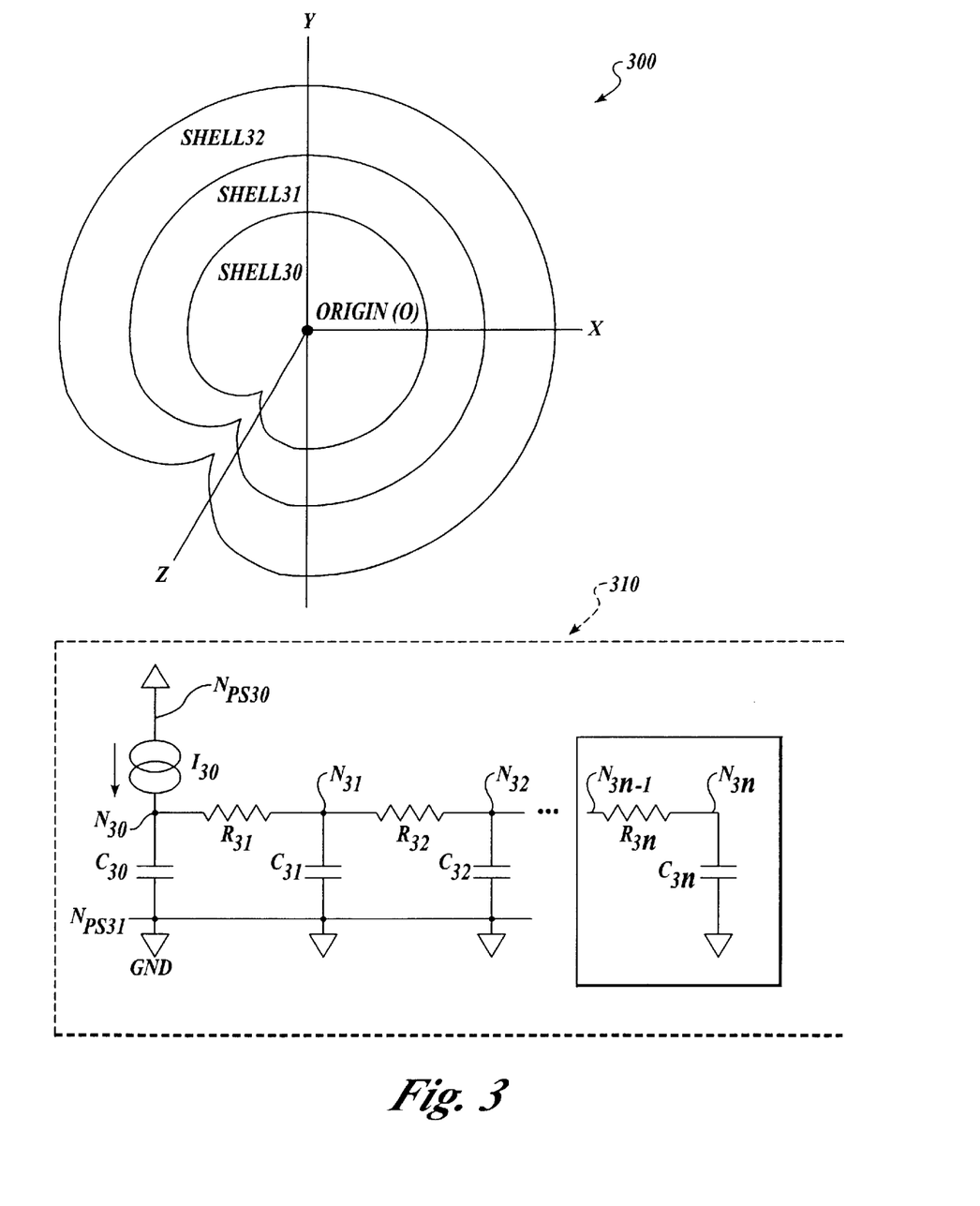
FIG. 3 is a schematic diagram and a graph illustrating a thermal transfer characteristic of silicon.

FIG. 3 is a schematic diagram of a thermal model circuit (310) and a corresponding graph (300) that illustrate the thermal heat transfer characteristics of a semiconductor material (e.g., silicon). The graph (300) includes an origin (O), a center shell (30), and subsequent shells (31, 32, . . . 3n). The thermal model circuit (310) includes a current source ($I_{30}$), a capacitor ($C_{30}$), and a plurality of resistor and capacitor circuits ($R_{31}C_{31}$, $R_{32}C_{32}$, . . . $R_{3n}C_{3n}$).

Graph 300 illustrates a thermal transfer characteristic of a semiconductor material (e.g. Silicon). Silicon material has a crystalline structure. The propagation of heat through silicon can be modeled as a series of concentric shells having an increased distance form an origin. Heat will distribute uniformly across each shell and decrease with distance from the point of application of the thermal energy. A heat source is located at the origin (O) of the graph (300). Heat radiates from the origin (O) to subsequent shells (30, 31, . . . , 3n). The shells extend in three-dimensional space along three axes (x, y, and z). Each subsequent shell (31, 32, . . . 3n) is located a further physical distance away from the origin (O). A time delay (τ) is associated with the rate at which heat is transferred (thermal transfer rate or thermal time constant) from the origin (O) to the outer shells to a distance (d) from the origin (O). The time delay (τ) is a function of distance from the thermal energy source and is independent of the amplitude, frequency, and duty cycle of the electrical signal originally giving rise to the heat pulse.

The propagation of thermal energy through silicon may be modeled as a signal applied to an RC network, such as illustrated by thermal model circuit (310). The current source ($I_{30}$) is coupled to a power supply node ($N_{PS30}$), and provides a current to another node ($N_{30}$). Capacitor $C_{30}$ is coupled between node $N_{30}$ and another power supply node ($N_{PS31}$). Resistor $R_{31}$ is coupled between nodes $N_{30}$ and $N_{31}$. Capacitor $C_{31}$ is coupled between node $N_{31}$ and power supply node $N_{PS31}$. Additional pairs of resistor and capacitor networks ($R_{32}$, $C_{32}$, . . . , $R_{3N}$, $C_{3N}$) are arranged similar to $R_{31}$ and $C_{31}$, coupled to nodes $N_{31}$–$N_{3N}$, forming a Nth order circuit.

Thermal model circuit 310 is an electronic circuit that simulates the thermal heat transfer characteristics of semiconductor material (e.g., silicon). The thermal heat transfer properties of the material are analogous to voltage and power. In model circuit 310, voltage corresponds to temperature and power corresponds to current. When a power pulse is applied to an area of semiconductor material, the heat travels across the material similar to current moving through an RC network. In other words, as the heat pulse travels through the material away from the heat source, the heat pulse will encounter less thermal resistance and more thermal capacitance.

The present invention utilizes the heat transfer characteristics of the semiconductor material to generate a signal at the input of a comparator such as comparator 210 illustrated in FIG. 2. A heat source (e.g., from heat circuit 1) is applied at an origin (o) that is located a distance (d) from a thermal sensor (e.g. thermal sensor 1). The heat pulse generated by the heat source corresponds to a signal applied to the input of the RC network illustrated in FIG. 3. A signal is subsequently received by the thermal sensor at the opposite end of the RC network, a distance (d) from the heat pulse.

As previously discussed, the thermal oscillator circuit (200) illustrated in FIG. 2 employs two thermal paths between pairs of heat circuits (220, 225) and thermal sensors (230, 235). During operation, the first heat circuit (e.g., heat circuit 1) will be enabled just as the second heat circuit (e.g., heat circuit 2) is disabled. As discussed with reference to FIG. 2, the semiconductor material has a thermal memory that is represented as a capacitance. The second thermal sensor (235) will remain relatively hot when the second heat circuit is disabled. Since the second thermal sensor is still hot, the signal that is produced by the sensor will still have a relatively high value. As the second sensor cools, the signal produced by that sensor will gradually decrease based on the thermal time constant in the reverse direction of the RC network. At the same time, the first heat circuit has been activated and heat is propagating towards the first thermal sensor. As more heat reaches the first thermal sensor, the signal produced by that sensor will gradually increase based on the thermal time constant in the forward direction of the RC network. Thus, a "race" condition is formed between the increasing signal in the first thermal sensor, and the decreasing signal in the second thermal sensor.

A simple PN junction can be configured to operate as sensor to sense the thermal pulse that is propagating through the semiconductor material. Since the thermal sensor is located away from the heat source (the output of the RC network), the heat signal will be attenuated and have a lower impact on the single PN junction. For example, assume the signal at the non-inverting input terminal (+) to the comparator circuit (i.e., 210) is higher than the signal at the inverting input terminal (−). In this instance, the output signal from the comparator (210) enables heat circuit 1 (220), causing the thermal sensor to gradually heat. To guarantee oscillation in the circuit (200), we need to ensure that the inverting input terminal (−) exceeds the non-inverting input terminal (+) of the comparator. Adding gain to the output of the sensor can ensure this. The gain can be simply increased by using a series combination of multiple PN junctions as the thermal sensor. In one embodiment, three PN junctions can be arranged in series to multiply the gain of the sensor element by three. Thus, the signal at the inverting input will always exceed the positive input, guarantying that oscillations will occur.

Figure 4:
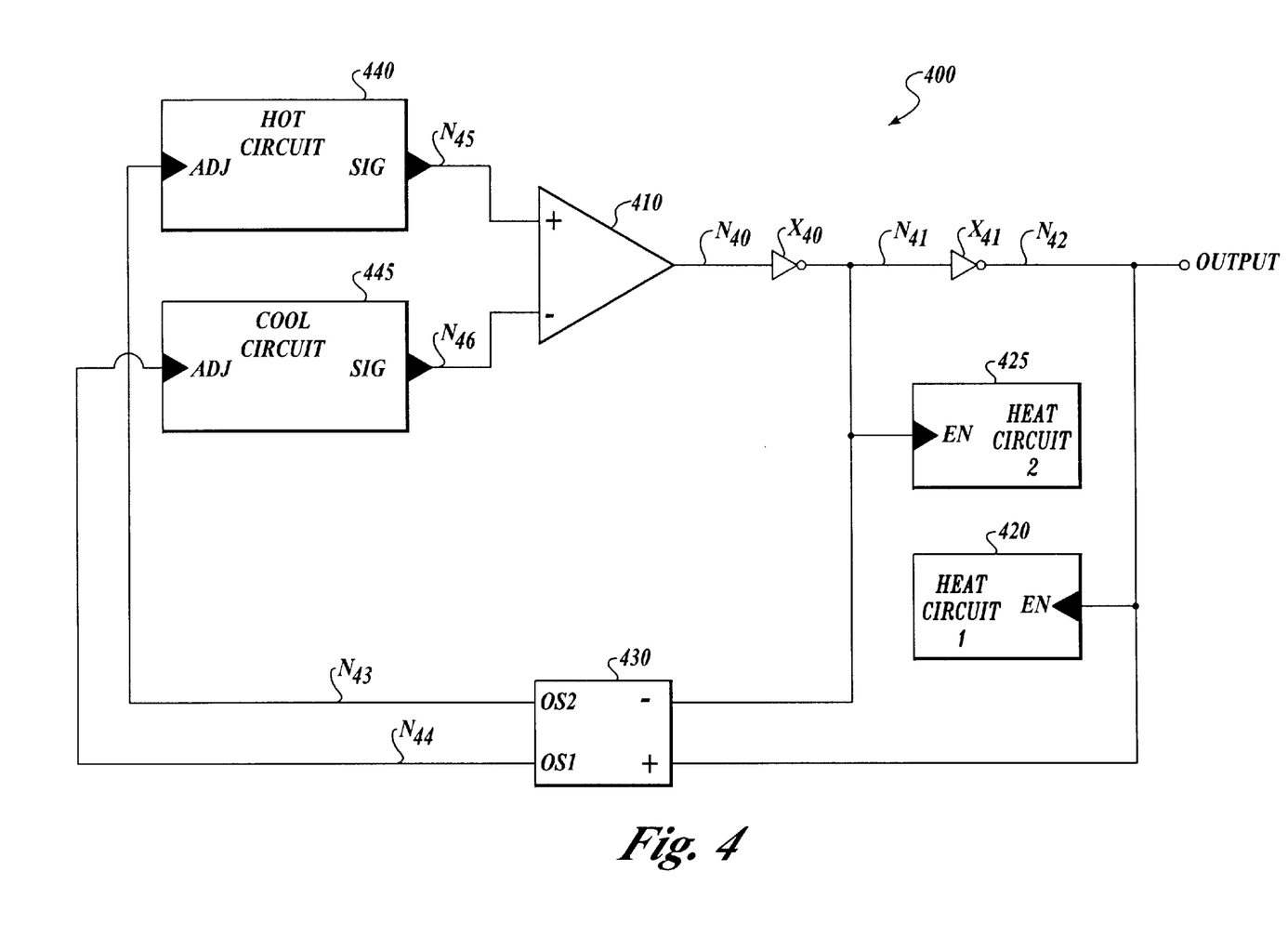
FIG. 4 is a schematic diagram illustrating another example of a thermal oscillator circuit that is in accordance with the present invention.

FIG. 4 is a schematic diagram illustrating an example of a thermal oscillator circuit (400) that is in accordance with the present invention. In FIG. 4, the thermal oscillator circuit (400) includes a comparator circuit (410), heat circuits (420 and 425), an auto zero circuit (430), a hot circuit (440), a cool circuit (445), and inverters ($X_{40}$ and $X_{41}$).

The comparator circuit (410) includes a non-inverting input (+) that is coupled to a node ($N_{45}$), an inverting input (−) that is coupled to a node ($N_{46}$), and an output terminal that is coupled to a node ($N_{40}$). Inverter $X_{40}$ is coupled between node $N_{40}$ and node $N_{41}$. Inverter $X_{41}$ is coupled between node $N_{41}$ and node $N_{42}$. An output terminal (Output) is coupled to node $N_{42}$. Heat circuit I (420) includes an adjustment terminal (ADJ) that is coupled to node $N_{42}$. Heat circuit 2 (425) includes an adjustment terminal (ADJ) that is coupled to node $N_{41}$. The auto zero circuit (430) operates similar to a comparator that provides two outputs. Auto zero circuit 430 includes a differential input that is coupled to node $N_{42}$ and node $N_{41}$, and a pair of outputs (OS1, OS2) that are coupled to node $N_{44}$ and node $N_{43}$ respectively. The hot circuit (440) includes an adjustment terminal (ADJ) that is coupled to node $N_{43}$, and a signal terminal (SIG) that is coupled to node $N_{45}$. The cool circuit (445) includes an adjustment terminal (ADJ) that is coupled to node $N_{44}$, and a signal terminal (SIG) that is coupled to node $N_{45}$.

The hot and cool circuits (440, 445) include thermal sensors similar to that shown in FIG. 2. In operation, the thermal sensors within the hot and cool circuits (440, 445) produce signals at nodes $N_{45}$ and $N_{46}$ respectively in response to the heat circuits (420, 425). One of the thermal sensors in the hot and cool circuits (440, 445) will receive heat, while the other thermal sensor is cooling down. The signals levels at nodes $N_{45}$ and $N_{46}$ will change in response to their respective heat level. A further discussion of the thermal sensor circuits will be provided later with respect to FIG. 6.

The comparator (410) produces a signal at node $N_{40}$ in response to a comparison between signals at nodes $N_{45}$ (+) and $N_{46}$ (−) respectively. The comparator (410) activates one of the heat circuits (420, 425) at a time. For example, heat circuit 1 (420) is activated when the output of the comparator at node $N_{40}$ is high, resulting in the output of the inverter ($X_{41}$) at node $N_{42}$ to also be high. Since the output of the inverter ($X_{40}$) at node $N_{41}$ is low, heat circuit 2 (425) is deactivated. Thus, the comparator (410) is arranged such that the output of the comparator selectively activates and deactivates the heat circuits (420, 425) to form a closed loop oscillation.

The auto zero circuit 430 produces offset signals (OS2, OS1) that are coupled to the adjustment terminals (ADJ) of the cool and hot circuits (440, 445) respectively. The offset signals are arranged to compensate for low frequency drift in the frequency and/or duty cycle of the thermal oscillator circuit (400). By gradually adjusting the offset signals (OS2, OS1) the oscillation frequency is stabilized. As discussed previously with respect to FIG. 2, the auto zero circuit is arranged to respond very slowly with respect to the oscillation frequency using time based circuits with a relatively long time constant. Thus, the overall offset of the hot and cool circuits (440 and 445) is gradually adjusted by an average offset.

The signal levels at nodes $N_{45}$ and $N_{46}$ may be rather small. The comparator (410) must be able to discriminate between these small signal levels. Thus, the offsets present in the hot and cool circuits (440 and 445) need to be small in comparison to the signals that are produced by the hot circuit (440) and cool circuit (445). An accurate comparison can be achieved by minimizing offsets that are presenting in the signals at nodes $N_{45}$ and $N_{46}$. The auto zero circuit (430) gradually compensates for offsets in the outputs of the signal terminals (SIG) of hot circuit 440 and cool circuit 445. Comparator 410 will compare the signals from the hot and cool circuits (440, 445) and produce a low logic output at node $N_{40}$. Since the signal at node $N_{41}$ is an inverse of the logic signal at node $N_{40}$, heat circuit 2 (425) is activated and heat circuit 1 (420) is, and the output of the comparator (410) operates as an output of the oscillator (400).

Figure 5:
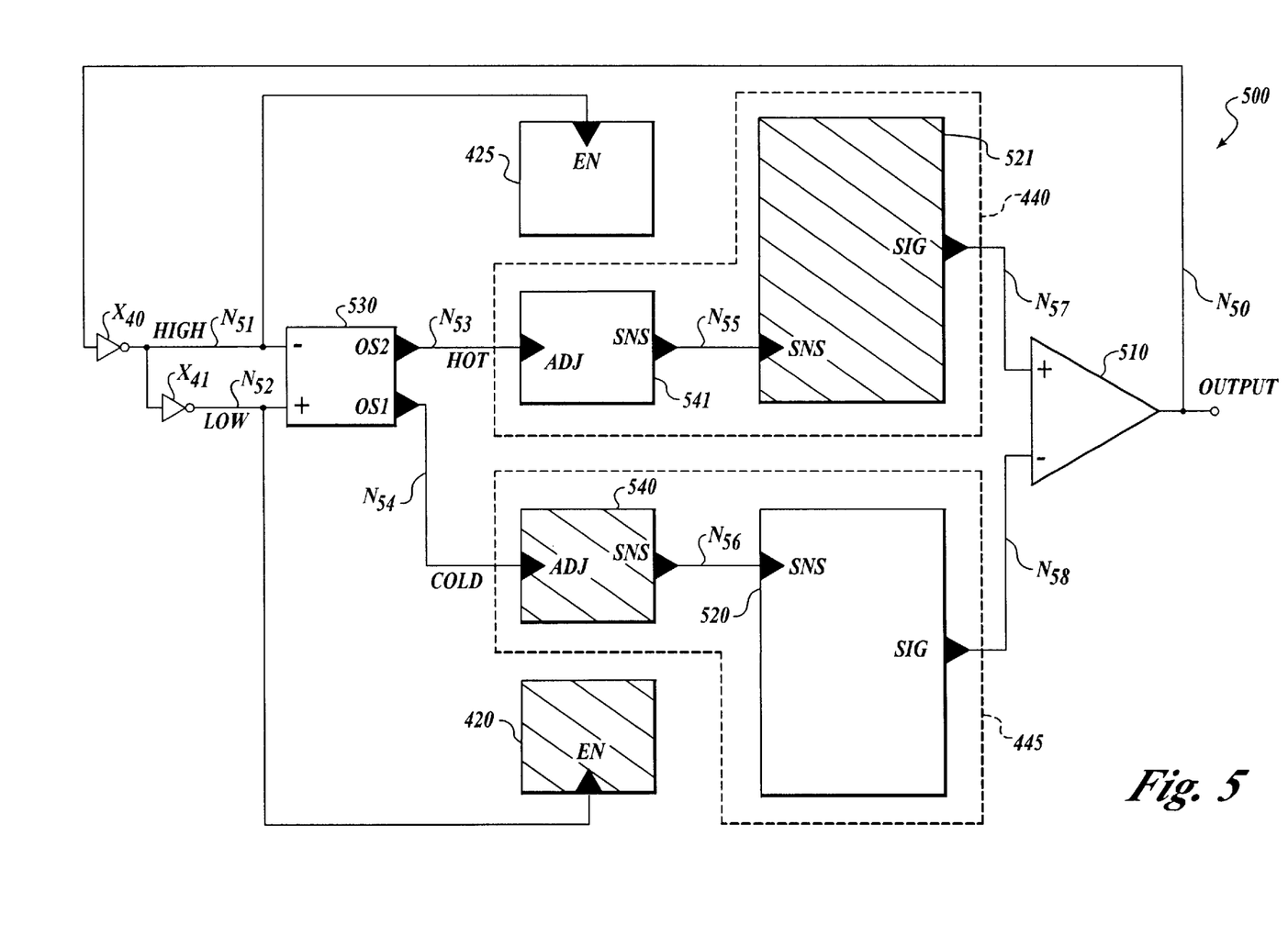
FIG. 5 is a schematic diagram illustrating an example of a thermal oscillator circuit that is in accordance with the present invention.

FIG. 5 is a schematic diagram illustrating an example of a thermal oscillator circuit (500) that is in accordance with the present invention. Like components from FIGS. 4 and 5 are labeled identically. In FIG. 5, the thermal oscillator circuit (500) includes a comparator circuit (510), heat circuits (420 and 425), an auto zero circuit (530), a hot circuit (440), a cool circuit (445), and two inverters ($X_{40}$ and $X_{41}$). Cool circuit 445 further includes a thermal sensor (520) and a reference circuit (540), while hot circuit 440 further includes another thermal sensor (521) and another reference circuit (541).

The comparator circuit (510) includes a non-inverting input (+) that is coupled to a node ($N_{57}$), an inverting input (−) that is coupled to a node ($N_{58}$), and an output terminal that is coupled to a node ($N_{50}$). Inverter $X_{40}$ is coupled between node $N_{50}$ and node $N_{51}$, while inverter $X_{41}$ is coupled between node $N_{51}$ and node $N_{52}$. An output terminal (OUTPUT) is coupled to node $N_{50}$. Heat circuit 1 (420) includes an enable terminal (EN) that is coupled to node $N_{52}$. Heat circuit 2 (425) includes an enable terminal (EN) that is coupled to node $N_{51}$. The auto zero circuit (530) includes a differential input that is coupled to node $N_{52}$ and node $N_{51}$, and output signals that are coupled to node $N_{54}$ and node $N_{53}$ respectively. Reference circuit 1 (540) includes an adjustment terminal (ADJ) that is coupled to node $N_{54}$, and a sensor terminal (SNS) that is coupled to node $N_{56}$. Thermal sensor 1 (520) includes a sense terminal (SNS) that is coupled to node $N_{56}$, and a signal terminal (SIG) that is coupled to node $N_{58}$. Reference circuit 2 (541) includes an adjustment terminal (ADJ) that is coupled to node $N_{53}$, and a sensor terminal (SNS) that is coupled to node $N_{55}$. Thermal sensor 2 (521) includes a sense terminal (SNS) that is coupled to node $N_{55}$, and a signal terminal (SIG) that is coupled to node $N_{57}$.

In FIG. 5, heat circuit 1 (420), reference circuit 1 (540), and thermal sensor 2 (521) are thermally coupled to one another. Similarly, heat circuit 2 (425), reference circuit 2 (541), and the thermal sensor 2 (520) are thermally coupled to one another. When heat circuit 1 (420) is activated, the thermal energy that is produced by heat circuit 1 is coupled to reference circuit 1 (540) and thermal sensor 2 (521). Similarly, when heat circuit 2 (420) is activated, the thermal energy that is produced by heat circuit 2 is coupled to reference circuit 2 (540) and thermal sensor 1 (520).

The thermal sensors (520, 521) produce signals that correspond to a particular heat level. The reference circuits (540, 541) are also responsive to heat and produce signal levels that are related to the heat levels in those circuits. The thermal sensors are arranged such that each thermal sensor produces a signal that decreases as it is heated, and increases when it is cooled. However, the combination of the reference circuits and the thermal sensors are arranged such that the signal level produced by a heated thermal sensor is initially increased by an offset before the signal level decreases. Similarly, the signal level produced by a cooling thermal sensor is initially decreased by an offset before the signal level increases.

The auto zero circuit (530) produces offset signals that are differentially related to the oscillation frequency and duty cycle. While the magnitude of the differential offset signals (OS1, OS2) change slowly with respect to the oscillation frequency, the polarity of the differential output signals corresponds to the current polarity of the output of the thermal oscillator circuit (500) at node N50. This is illustrated by the examples that follow below.

The comparator circuit (510) activates one heat circuit at a time. Heat circuit 1 (420) is activated when the output of the comparator at node $N_{50}$ is high, since the potential at node $N_{52}$ is also high. Since the potential at node $N_{51}$ is low, heat circuit 2 (425) is deactivated. Heat propagates from heat circuit 1 (420) to reference circuit 1 (540) and thermal sensor 2 (521). Reference circuit 1 (540) produces a signal at the sensor terminal (SNS) that corresponds to a low offset. Thermal sensor 1 (520) will produce a signal that initially decreases from the offset signal at node $N_{54}$, and begins to increase in amplitude since heat circuit 2 (425) is deactivated. Similarly, thermal sensor 2 (521) will produce a signal that initially increased from the offset signal at node $N_{53}$, and begins to decrease in amplitude since heat circuit 1 (420) is active.

Heat circuit 2 (425) is activated when the output of the comparator at node $N_{50}$ is low, since the potential at node $N_{51}$, is high. Since the potential at node $N_{52}$ is low, heat circuit 1 (420) is deactivated. Heat propagates from heat circuit 2 (425) to reference circuit 2 (541) and thermal sensor 1 (520). Reference circuit 2 (541) produces a signal at the sensor terminal (SNS) that corresponds to a low offset. Thermal sensor 2 (521) will produce a signal that initially decreases from the offset signal at node $N_{53}$, and begins to increase in amplitude since heat circuit 1 (420) is deactivated. Similarly, thermal sensor 1 (520) will produce a signal that initially increased from the offset signal at node $N_{54}$, and begins to decrease in amplitude since heat circuit 2 (425) is active.

Figure 6:
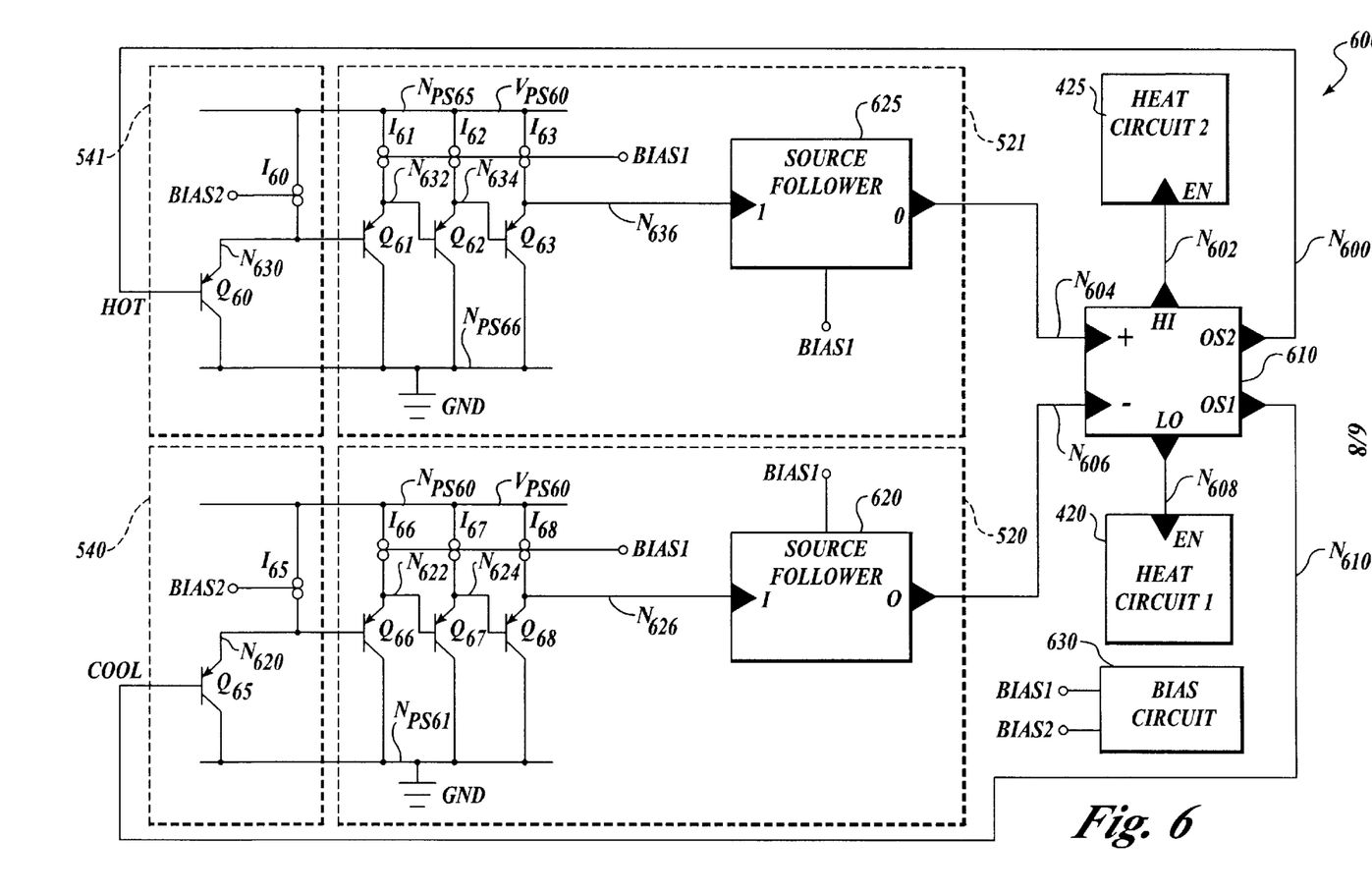
FIG. 6 is a schematic diagram illustrating an example of a thermal oscillator circuit that is in accordance with the present invention.

FIG. 6 is a schematic diagram illustrating an example of a thermal oscillator circuit (600) that is in accordance with the present invention. Like components from FIGS. 4, 5, and 6 are labeled identically. In FIG. 6, the thermal oscillator circuit (600) includes a comparator and auto zero circuit (610), heat circuits (420 and 425), two thermal sensor circuits (520 and 521), two reference circuits (540 and 541), and a bias circuit (630). Reference circuit 541 further includes a transistor ($Q_{60}$) and a current source ($I_{60}$). Thermal sensor circuit 521 further includes three transistors ($Q_{61}$–$Q_{63}$), three current sources ($I_{61}$–$I_{63}$), and a source follower (625). Reference circuit 540 further includes a transistor ($Q_{65}$) and a current source ($I_{65}$). Thermal sensor circuit (520) further includes three transistors ($Q_{66}$–$Q_{68}$), three current sources ($I_{66}$–$I_{68}$), and a source follower (620).

The comparator and auto zero circuit (610) includes a differential input between node $N_{604}$ and node $N_{606}$, and a differential offset output (OS1, OS2) between node $N_{610}$ and node $N_{600}$. The comparator and auto zero circuit (610) further includes a high signal terminal (HI) that is coupled to node $N_{602}$, and a low signal terminal (LO) that is coupled to node $N_{608}$. Heat circuit 1 (420) includes an enable terminal (EN) that is coupled to node $N_{608}$. Heat circuit 2 (425) includes an enable terminal (EN) that is coupled to node $N_{602}$. Bias circuit 630 includes two bias signal terminals (BIAS1 and BIAS2).

Transistor $Q_{60}$ includes a base that is coupled to node $N_{600}$, an emitter that is coupled to node $N_{630}$, and a collector that is coupled to power supply node $N_{PS66}$. Current source $I_{60}$ is arranged to provide current to node $N_{630}$. Transistor $Q_{61}$, includes a base that is coupled to node $N_{630}$, an emitter that is coupled to node $N_{632}$, and a collector that is coupled to power supply node $N_{PS66}$. Current source $I_{61}$ is arranged to couple current to node $N_{632}$. Transistor $Q_{62}$ includes a base that is coupled to node $N_{632}$, an emitter that is coupled to a node $N_{634}$, and a collector that is coupled to power supply node $N_{PS66}$. Current source $I_{62}$ is arranged to couple current to node $N_{634}$. Transistor $Q_{62}$ includes a base that is coupled to node $N_{634}$, an emitter that is coupled to node $N_{636}$, and a collector that is coupled to power supply node $N_{PS66}$. Current source $I_{63}$ is arranged to couple current to node $N_{636}$. Source follower circuit 625 includes an input terminal (I) that is coupled to node $N_{636}$ and an output terminal (O) that is coupled to node $N_{604}$. In operation, a power supply voltage ($V_{PS60}$) is provided to node $N_{PS65}$, and node $N_{PS66}$ operates as a circuit ground potential (GND).

Transistor $Q_{65}$ includes a base that is coupled to node $N_{610}$, an emitter that is coupled to node $N_{620}$, and a collector that is coupled to power supply node $N_{PS61}$. Current source $I_{65}$ is arranged to provide a current to node $N_{620}$. Transistor $Q_{66}$ includes a base that is coupled to node $N_{620}$, an emitter that is coupled to node $N_{622}$, and a collector that is coupled to power supply node $N_{PS61}$. Current source $I_{66}$ is arranged to provide a current to node $N_{622}$. Transistor $Q_{67}$ includes a base that is coupled to node $N_{622}$, an emitter that is coupled to node $N_{624}$, and a collector that is coupled to power supply node $N_{PS61}$. Current source $I_{67}$ is arranged to provide a current to node $N_{624}$. Transistor $Q_{68}$ includes a base that is coupled to node $N_{624}$, an emitter that is coupled to node $N_{626}$, and a collector that is coupled to power supply node $N_{PS6}$. Current source $I_{68}$ is arranged to provide a current to node $N_{626}$. Source follower circuit 620 includes an input terminal (I) that is coupled to node $N_{626}$ and an output terminal (O) that is coupled to node $N_{606}$. In operation, a power supply voltage ($V_{PS60}$) is provided to node $N_{PS60}$, and node $N_{PS61}$ operates as a circuit ground potential (GND).

The basic operation of the oscillator circuit illustrated in FIG. 6 is the same as that described previously for FIGS. 2, 4 and 5. The functions of the comparator circuit (510) and the auto zero circuit (530) from FIG. 5 have been combined into the comparator and auto zero circuit (610) illustrated in FIG. 6. FIG. 6 includes a further detailed schematic for the reference circuits (540, 541) and thermal sensors (520, 521) that are illustrated in FIG. 5.

The operation of the comparator and auto zero circuit (610) is substantially the same as the operations described in FIG. 5. For example, when the output of the comparator and auto zero circuit (610) at node $N_{608}$ is high, the output at node $N_{602}$ is low, and a differential offset signal is produced between node $N_{610}$ and $N_{600}$ that has a negative polarity. Similarly, when the output of the comparator and auto zero circuit (610) at node $N_{608}$ is low, the output at node $N_{602}$ is high, and a differential offset signal is produced between node $N_{610}$ and $N_{600}$ that has a positive polarity. The magnitude of the differential offset signal is determined by an average duty cycle and frequency as discussed previously with the previous examples.

Bias circuit 630 is arranged to provide a bias signal (BIAS1) to the thermal sensor circuits (520 and 521), and a second bias signal (BIAS2) to the reference circuits (540 and 541). The bias signals (BIAS1 and BIAS2) are arranged to adjust out the temperature coefficient of the semiconductor material (e.g., silicon) and/or to adjust the frequency of the thermal oscillator circuit 600.

Reference circuits 540 and 541 are essentially emitter follower sensors. Thermal sensor circuit 520 and 521 are essentially three emitter follower sensors that are coupled to a source follower type of level shifter circuit. The first reference circuit (540) is thermally coupled to the first heat circuit (420), while the second reference circuit (541) is thermally coupled to the second heat circuit (425). However, the emitter followers in thermal sensor circuit 520 are thermally coupled to the first heat circuit (420), while the emitter followers in the other thermal sensor circuit (521) are thermally coupled to the second heat circuit (425). Thus, thermal sensor circuits 520 and 521 are thermally coupled to the opposite heat circuits than those that are thermally coupled to reference circuits 520 and 521.

In this example, when an increased offset signal is received at the base of transistor $Q_{65}$, the emitter voltage of transistor $Q_{65}$ (node $N_{620}$) will increase by the amount of the offset signal. The potential at node $N_{620}$ is also determined by the operating current of transistor $Q_{65}$, which is determined in part by current source $I_{65}$. Current source I65 produces a current that is determined by the bias signal (BIAS2). The signal at node $N_{626}$ corresponds to the voltage at node $N_{620}$ plus the base-emitter voltages of transistors $Q_{66}$, $Q_{67}$, and $Q_{68}$. Transistors $Q_{66}$–$Q_{68}$ are forward biased and operating at current levels determined by current sources $I_{66}$–$I_{68}$ respectively. A bias signal (BIAS1) determines the current levels of current sources $I_{66}$–$I_{68}$. All of these transistors ($Q_{65}$–$Q_{68}$) have base-emitter voltages that are responsive to temperature with a temperature coefficient of approximately –2 mV/° C. The voltage at node N626 can be determined by adding the individual base-emitter voltage contributions of transistors $Q_{65}$–$Q_{68}$. Since, transistors $Q_{66}$–$Q_{68}$ are thermally coupled to beat circuit 2 (425), and transistor $Q_{65}$ is thermally coupled to heat circuit 1 (420), the voltage contribution from transistor $Q_{65}$ will be increasing when the voltage contribution from transistors $Q_{66}$–$Q_{68}$ is decreasing, and vice-versa.

Heat circuit 1 (420) is activated concurrent with $Q_{65}$ receiving the high offset signal. Heat propagates from heat circuit 1 (420) to reference circuit 1 (540) and thermal sensor circuit 521. Increasing the temperature of transistor $Q_{65}$ results in a corresponding decrease in the value of the voltage drop across the base-emitter junction of transistor $Q_{65}$. The decrease in the value of the voltage drop across the base-emitter junction of transistor $Q_{65}$ is approximately 2 mV for each ° C. increase in temperature (–2 mV/° C.).

The signal at node $N_{626}$ is then coupled to the input terminal (I) of source follower 620. Source follower 620 provides a level shift thereby producing a signal at node $N_{602}$ that has a value equal to the value of the signal at node $N_{626}$ less the voltage drop ($V_{TH}$) across the source follower (620). The value of the voltage drop ($V_{TH}$) is dependent upon the bias signal that is received from bias signal terminal (BIAS1). The signal at node $N_{604}$ is approximately equal to the value of the signal at node N636 less the voltage drop across source follower 620 ($V_{TH}$). The value of the voltage drop across source follower 620 is dependent upon the bias signal that is received from bias signal terminal (BIAS1). Comparator and auto zero circuit 610 receives the signal from node $N_{606}$ and compares it to the signal received from node $N_{604}$. When the signal received from node $N_{606}$ exceeds the signal received from node $N_{604}$, the comparators outputs at nodes $N_{602}$ and $N_{608}$ change states.

A positive thermal pulse is produced by the activation of one of the heat circuits (e.g., 425). The positive thermal pulse results in heat traveling through the semiconductor material in a similar manner as an RC network as illustrated in FIG. 3. The thermal sensor circuit (e.g., 520) receives a small thermal signal at the opposite end of the RC network. Gain is applied to the small thermal signal to improve performance. The three transistors that are arranged as emitter followers, similar to stacked diodes to accomplish the gain of the thermal signal. The stacked diodes have temperature coefficients such that the diode voltages shift in response to the thermal signal. When all three diodes are biased identically, they should all have substantially the same temperature coefficient. By adjusting the current densities of the diode junctions, the gain of the diodes can be adjusted.

Figure 7:
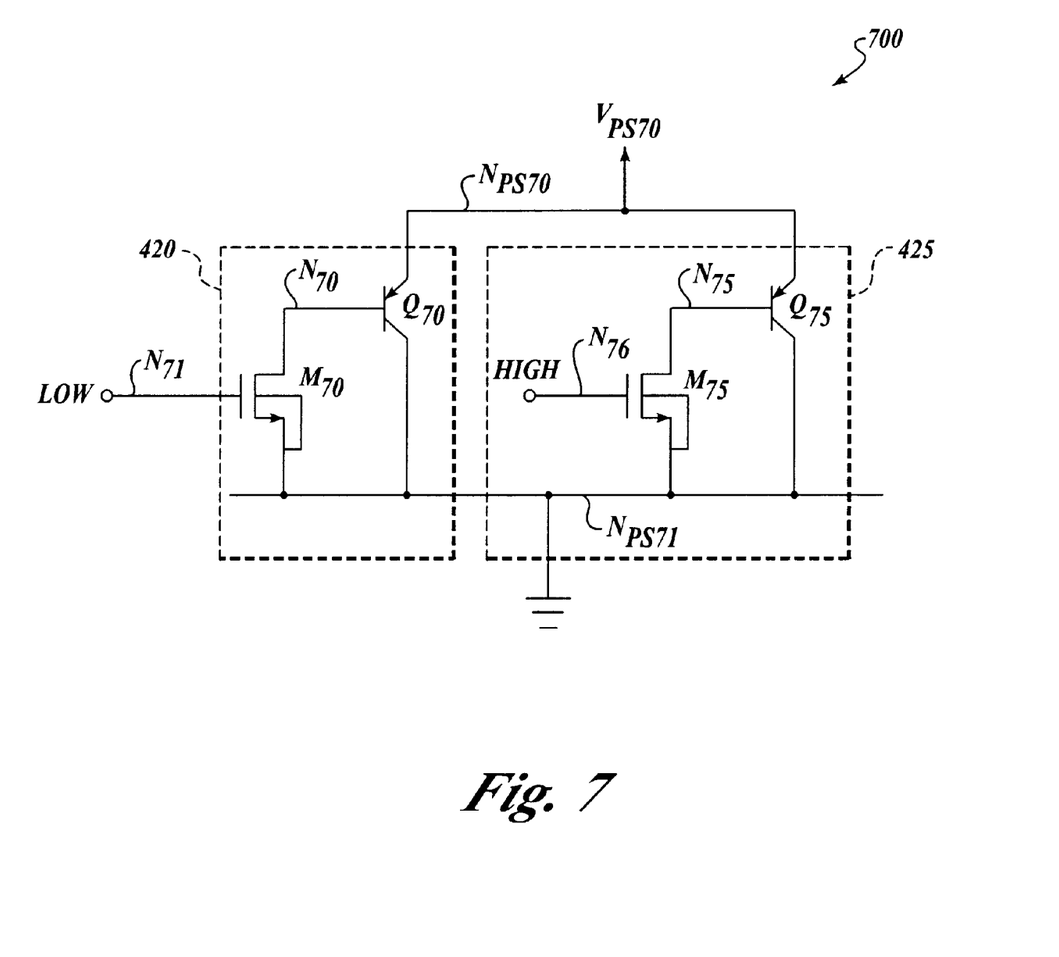
FIG. 7 is a schematic diagram illustrating an exemplary heater circuit that is in accordance with the present invention.

FIG. 7 is a schematic diagram illustrating an exemplary heat circuit (700) that is in accordance with the present invention. Like components from FIGS. 4, 5 and 7 are labeled identically. In FIG. 7, the exemplary heat circuit (700) includes a first heat circuit (420) and a second heater circuit (425). The first heat circuit (420) includes two transistors ($M_{70}$ and $Q_{70}$). The second hear circuit (425) includes two transistors ($M_{75}$ and $Q_{75}$). Transistor $M_{70}$ includes a gate coupled to node $N_{71}$, a drain coupled to node $N_{70}$, and a source coupled to a power supply node ($N_{PS71}$). Transistor $Q_{70}$ includes a base that is coupled to node $N_{70}$, an emitter that is coupled to a power supply node ($N_{PS70}$), and a collector that is coupled to the power supply node ($N_{PS71}$). Transistor $M_{75}$ includes a gate that is coupled to node $N_{76}$, a drain that is coupled to node $N_{75}$, and a source that is coupled to the power supply node ($N_{PS71}$). Transistor $Q_{75}$ includes a base that is coupled to node $N_{75}$, an emitter that is coupled to the power supply node ($N_{PS70}$), and a collector that is coupled to power supply node $N_{ps71}$. A first input signal terminal (LOW) is coupled to node $N_{71}$, while a second input signal terminal (HIGH) is coupled to node $N_{76}$.

In operation, a high power supply potential ($V_{PS70}$) is coupled to node $N_{PS70}$, while a circuit ground potential (GND) is coupled to node $N_{PS71}$. Heat circuits 420 and 425 are activated by the first and second input signal terminals (LOW and HIGH) respectively. However, both heat circuits are not activated simultaneously. For example, if a high potential is coupled to node $N_{71}$, heat circuit 1 (420) will be activated. Transistor $M_{70}$ is then biased "on", and the base of transistor $Q_{70}$ is coupled through transistor $M_{70}$ to the circuit ground potential (GND) and transistor $Q_{70}$ is forward biased. Transistor $Q_{70}$ will begin to produce heat while it is forward biased. Transistor $Q_{75}$ is similarly biased by activation of transistor $M_{75}$.

Although the transistors ($M_{70}$, $M_{75}$, $Q_{70}$, and $Q_{75}$) are shown as n-type field effect transistors and PNP bipolar junction transistors respectively, any other appropriate electronic components may be arranged to act as a controlled heat source.

Figure 8:
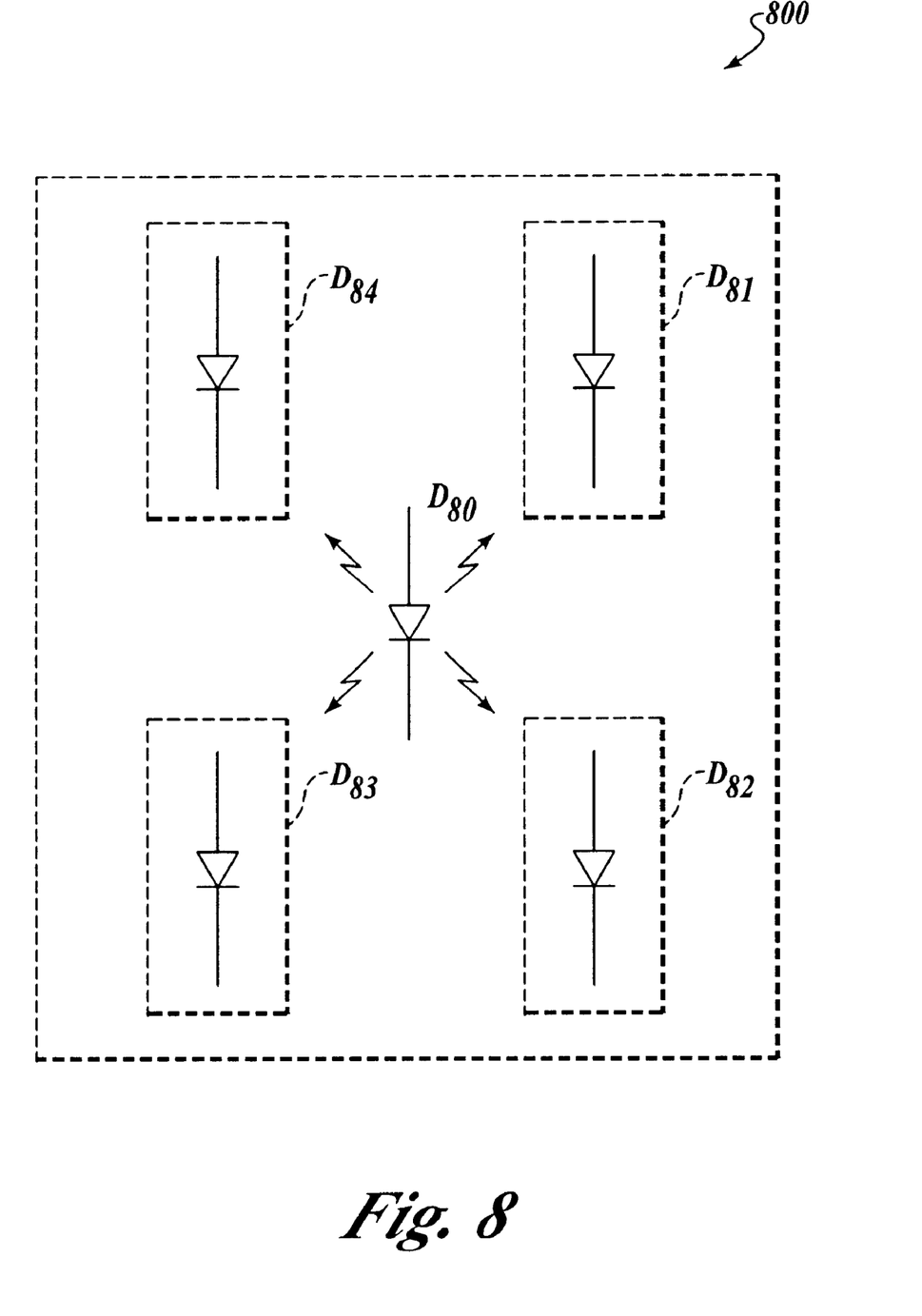
FIG. 8 is a schematic diagram illustrating an exemplary arrangement for a reference circuit that is in accordance with the present invention.

FIG. 8 is a schematic diagram illustrating an exemplary arrangement for reference circuit (800) that is in accordance with the present invention. The exemplary arrangement for reference circuit (800) includes a selectable heat source ($D_{80}$) and four thermally activated references devices ($D_{81}$–$D_{84}$). Selectable heat source $D_{80}$ is thermally coupled to each of the diode devices ($D_8$–$D_{84}$). The exemplary arrangement illustrates a physical arrangement of devices that results in thermal coupling between a heat source (e.g., heat circuit 1, 420), a thermally responsive reference circuit (e.g., reference circuit 1, 540), and a thermal sensor circuit (e.g., 521).

In one embodiment, the heat source ($D_{80}$) represents one of transistors $Q_{70}$ and $Q_{70}$ of the corresponding heat circuit (420, 425) illustrated in FIG. 7. One of the remaining four thermally activated diode devices ($D_{81}$–$D_{84}$) is utilized as a thermal sensor such as one of transistors $Q_{60}$ and $Q_{65}$ of a corresponding reference circuit (540, 541) illustrated in FIG. 6. The remaining three thermally activated diode devices represent the transistors of one of the thermal sensor circuits (520, 521) as illustrated in FIG. 6.

Although the thermally activated references devices ($D_{81}$–$D_{84}$) are shown as diodes in FIG. 8, other arrangements of transistors may be utilized. For example, a heat circuit (426) is thermally coupled to a thermal sensor (521) and a reference circuit (540) as illustrated in FIG. 5. This example may be implemented using PNP transistors such as transistors $Q_{65}$, $Q_{61}$–$Q_{63}$ and $Q_{70}$ as illustrated in FIGS. 6 and 7. In this example, transistor $Q_{70}$ is located in a central location and the remaining transistors ($Q_{65}$, $Q_{61}$–$Q_{63}$) are located near transistor $Q_{70}$ for thermal coupling.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus for producing an oscillation frequency utilizing the thermal heat transfer characteristics of a semiconductor material, a thermal oscillator comprising:

a heat circuit that is arranged to selectively produce a heat signal in response to an output signal;

a reference circuit that is arranged to produce a reference signal;

a thermal sensor circuit that is arranged to produce a sense signal in response to the heat signal and the reference signal; and a comparator circuit that is arranged to produce the output signal in response to the sense signal such that the output signal oscillates between two signal levels at the oscillation frequency, wherein the oscillation frequency is determined by a time constant associated with the heat transfer characteristics of the semiconductor material.

2. The apparatus of claim 1, wherein the heat circuit and the thermal sensor circuit are separated by a predetermined distance such that the heat signal propagates through the semiconductor material from the heat circuit to the thermal sensor, and the oscillation frequency is related to the predetermined distance.

3. The apparatus of claim 1, wherein the thermal sensor circuit has an associated sensitivity level that is adjusted by a biasing signal such that the oscillation frequency is adjusted by the biasing signal.

4. The apparatus of claim 1, wherein the reference circuit has an associated signal level that is adjusted by a biasing signal such that the oscillation frequency is adjusted by the biasing signal.

5. The apparatus of claim 1, further comprising an auto-zero circuit that is arranged to produce an offset signal in response to at least one of the oscillation frequency and a duty cycle that is associated with the thermal oscillator, wherein the reference circuit is arranged to vary the reference signal in response to the offset signal.

6. The apparatus of claim 5, the auto-zero circuit further comprising an integrator circuit that has a time constant that substantially longer than a period associated with the oscillation frequency such that the offset signal is a slowly varying average signal.

7. The apparatus of claim 1, further comprising a temperature coefficient adjustment circuit that is arranged to produce biasing signals for the thermal sensor circuit and the reference circuit such that the temperature coefficient of the semiconductor material is compensated.

8. An apparatus for producing an oscillation signal that has an associated oscillation frequency utilizing the thermal heat transfer characteristics of a semiconductor material, the thermal oscillator comprising:

a first heat circuit that is arranged to selectively produce a first heat signal in response to the oscillation signal;

a second heat circuit that is arranged to generate a second heat signal when activated by an inverse of the oscillation signal;

a first reference circuit that is arranged to produce a first reference signal in response to the second heat signal;

a second reference circuit that is arranged to produce a second reference signal in response to the first heat signal;

a first thermal sensor circuit that is arranged to produce a first sense signal in response to the first heat signal and the first reference signal;

a second thermal sensor circuit that is arranged to produce a second sense signal in response to the second heat signal and the second reference signal;

a comparator circuit that is arranged to produce the oscillation signal in response to the first and second sense signals such that the oscillation signal oscillates between two signal levels at the oscillation frequency, wherein the oscillation frequency is determined by a time constant associated with the heat transfer characteristics of the semiconductor material.

9. The apparatus of claim 8, further comprising a temperature coefficient adjustment circuit that is arranged to produce a biasing signal for the first thermal sensor circuit such that the biasing signal adjusts a sensitivity of the first thermal sensor circuit to compensate for at least one of a temperature coefficient associated with the semiconductor material and the oscillation frequency.

10. The apparatus of claim 8, further comprising a temperature coefficient adjustment circuit that is arranged to produce a biasing signal for the first reference circuit such that the biasing signal adjusts a signal level of the first reference circuit to compensate for at least one of a temperature coefficient associated with the semiconductor material and the oscillation frequency.

11. The apparatus of claim 8, further comprising an auto-zero circuit that is arranged to selectively couple an averaged offset signal to one of the first and second reference circuits in response to the oscillation signal such that the thermal oscillator produces a stable oscillation frequency.

12. The apparatus of claim 11, the auto-zero circuit further comprising an integrator circuit that has an associated integration time that is greater than a period associated with the oscillation frequency such that the averaged offset signal is a slowly varying dc signal.

13. The apparatus of claim 8, wherein the first reference circuit is heated by the first heat circuit when the first thermal sensor circuit is cooling, the second reference circuit is heated by the second heat circuit when the second thermal sensor circuit is cooling, and the first and second heat circuits are activated at different time intervals corresponding to different states of the oscillation signal.

14. The apparatus of claim 8, wherein the first heat circuit includes a transistor that is arranged to produce thermal energy when activated by the oscillation signal, and the second heat circuit includes another transistor that is arranged to produce thermal energy when activated by the inverse of the oscillation signal.

15. The apparatus of claim 8, wherein each of the first and second thermal sensor circuits include electronic components that are arranged to operate as three diodes connected in series such that a potential across the electronic components change in response to thermal energy that is coupled thereto.

16. The apparatus of claim 8, wherein each of the first and second thermal sensor circuits includes three emitter follower circuits that are arranged to operate as three diodes connected in series such that a potential across the three emitter follower circuits changes in response to thermal energy that is coupled thereto.

17. The apparatus of claim 16, wherein each of the first and second thermal sensor circuits further includes a level shifter circuit that is arranged to produce a level shifted signal that is coupled to the comparator circuit, wherein the level shifted signal is associated with the potential across the three emitter follower circuits.

18. A method for producing an output signal with a corresponding oscillation frequency and duty cycle utilizing thermal heat transfer characteristics of a semiconductor material, comprising:
    comparing a first input signal and a second input signal with a comparator;
    producing the output signal in response to the comparison;
    activating a first heat source to produce first heat signal in response to the output signal when the output signal corresponds to a first logic level;
    activating a second heat source to produce a second heat signal in response to the output signal when the output signal corresponds to a second logic level that is different from the first logic level;
    sensing the first heat signal to produce a first sense signal with a first thermal sensor;
    sensing the second heat signal to produce a second sense signal with a second thermal sensor;
    producing the first input signal in response to the first sense signal; and
    producing the second input signal in response to the second sense signal such that the output signal oscillates between the first and second logic level at a rate corresponding to the oscillation frequency.

19. The method of claim 18, further comprising: stabilizing the oscillation frequency by compensating for a temperature coefficient associated with the semiconductor material.

20. The method of claim 18, further comprising: adjusting the oscillation frequency by at least one of moving a location of the first thermal sensor with respect to the first heat source, moving a location of the second thermal sensor with respect to the second heat source, adjusting a bias for the first thermal sensor, and adjusting a bias for the second thermal sensor.

21. The method of claim 18, further comprising: adjusting the duty cycle of the output signal by at least one of moving a location of the first thermal sensor with respect to the first heat source, moving a location of the second thermal sensor with respect to the second heat source, adjusting a bias for the first thermal sensor, and adjusting a bias for the second thermal sensor.

22. An apparatus that produces an output signal with a corresponding oscillation frequency utilizing the thermal characteristics of a semiconductor material, comprising:
    a comparison means that is arranged to produce an output signal in response to a comparison between a first input signal and a second input signal;
    a first heat means that is arranged to produce a first heat signal when the output signal is a first logic level;
    a second heat means that is arranged to produce a second heat signal when the output signal is a second logic level that is different from the first logic level;
    a first sense means that is arranged to produce the first input signal in response to the first heat signal;
    a second sense means that is arranged to produce the second input signal in response to the first heat signal, wherein the first and second input signals form a differential input signal for the comparison means such that output signal oscillates between the first and second logic levels at an oscillation frequency that is related to the thermal characteristics of the semiconductor material.

23. The apparatus of claim 22, further comprising an offset cancellation means that is arranged to minimize offsets in the comparison means.

24. The apparatus of claim 22, the first sense means further comprising: a first reference means that is arranged to produce a first reference signal, and a first sensor means that is arranged to produce the first input signal in response to the second heat signal and the first reference signal.

25. The apparatus of claim 22, the second sense means further comprising: a second reference means that is arranged to produce a second reference signal, and a second sensor means that is arranged to produce the second input signal in response to the first heat signal and the second reference signal.

26. The apparatus of claim 22, further comprising a temperature coefficient adjustment means that is arranged to adjust biasing signals for the first and second sense means such that changes in the oscillation frequency that are due to the temperature coefficient of the semiconductor material are compensated.

* * * * *